(12) United States Patent
Ming et al.

(10) Patent No.: US 11,355,574 B2
(45) Date of Patent: Jun. 7, 2022

(54) FLEXIBLE DISPLAY PANEL AND MANUFACTURING METHOD THEREOF

(71) Applicant: Wuhan China Star Optoelectronics Semiconductor Display Technology Co., Ltd., Hubei (CN)

(72) Inventors: Xing Ming, Hubei (CN); Zhongtao Cao, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 210 days.

(21) Appl. No.: 16/624,796

(22) PCT Filed: Oct. 21, 2019

(86) PCT No.: PCT/CN2019/112122
§ 371 (c)(1),
(2) Date: Dec. 19, 2019

(87) PCT Pub. No.: WO2021/003880
PCT Pub. Date: Jan. 14, 2021

(65) Prior Publication Data
US 2021/0343820 A1    Nov. 4, 2021

(30) Foreign Application Priority Data

Jul. 5, 2019 (CN) .......................... 201910606260.6

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 27/3258* (2013.01); *H01L 51/0097* (2013.01);
(Continued)

(58) Field of Classification Search
None
See application file for complete search history.

(56) References Cited

U.S. PATENT DOCUMENTS

2017/0097529 A1    4/2017  Kubota et al.
2018/0286938 A1*  10/2018  Moon ................. H01L 51/0097
(Continued)

FOREIGN PATENT DOCUMENTS

CN    106164762 A    11/2016
WO    2019026237 A1   2/2019

*Primary Examiner* — J. E. Schoenholtz
(74) *Attorney, Agent, or Firm* — Geoffrey A. Lottenberg; Berger Singerman LLP (57) ABSTRACT

The present invention provides a display panel and a manufacturing method thereof. The display panel includes a flexible substrate, a buffer layer, a combination insulation layer, recess, an organic insulation layer, and a first wire changing layer. The first wire changing layer is disposed on an upper surface of the organic insulation layer and extends to the combination insulation layer. The present invention removes a through hole in a conventional organic insulation layer, on one hand mitigates the issue of broken lines in the first wire changing layer, and on the other hand mitigates the issue of shorting of adjacent two of wires in the first wire changing layer because of square waveform, sawtooth waveform, triangular waveform, and sinusoidal waveform of an edge line on a side of the first wire changing layer such that stability of the display panel is improved.

9 Claims, 11 Drawing Sheets

(52) U.S. Cl.
CPC ........ *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 2018/0342707 A1* | 11/2018 | Lee | ............... H01L 27/3279 |
| 2019/0041915 A1* | 2/2019 | Park | ............... H01L 51/56 |
| 2019/0288048 A1* | 9/2019 | Kang | ............... H01L 27/1218 |
| 2019/0355800 A1 | 11/2019 | Saitoh et al. | |
| 2021/0005702 A1* | 1/2021 | Saitoh | ............... G09F 9/00 |

* cited by examiner

FLEXIBLE DISPLAY PANEL AND MANUFACTURING METHOD THEREOF

CROSS-REFERENCE TO RELATED APPLICATIONS

This application is the National phase under 35 U.S.C. § 371 of International Application No. PCT/CN2019/112122, filed Oct. 21, 2019, which claims the benefit of and priority to Chinese Patent Application No. 201910606260.6, filed Jul. 5, 2019. The entire contents of these patent applications are hereby incorporated by reference herein.

FIELD OF INVENTION

The present invention relates to a field of displays, especially to a flexible display panel and a manufacturing method thereof.

BACKGROUND OF INVENTION

Organic light emitting diodes (OLEDs) can be classified into two primary classifications of passive matrix OLEDs (PM-OLEDs) and active matrix OLEDs (AM-OLEDs). Active matrix display panels comprise flexible folding display panels and rigid display panels. The flexible folding display panel comprises low temperature polycrystalline silicon thin film transistors, LTPS TFTs). Manufacturing processes of the flexible folding display panel comprise 10-15 processes, which are 2-3 mask processes more than processes of the rigid AMOLED display panel. The flexible folding AMOLED LTPS display panel comprises a displaying region and a non-displaying region. Additional processes are mainly configured to etch inorganic thin films with poor flexibility in a folding region by lithography and dry etching process and then fill polyimide (PI) material (O-ILD) with excellent organic flexibility, which facilitates folding characteristic thereof.

At present, a flexible folding active matrix AMOLED LTPS display panel is divided into a displaying region and a non-displaying region. The non-displaying region comprises a first folding region, a folding portion, and a second folding region.

Figure 1:
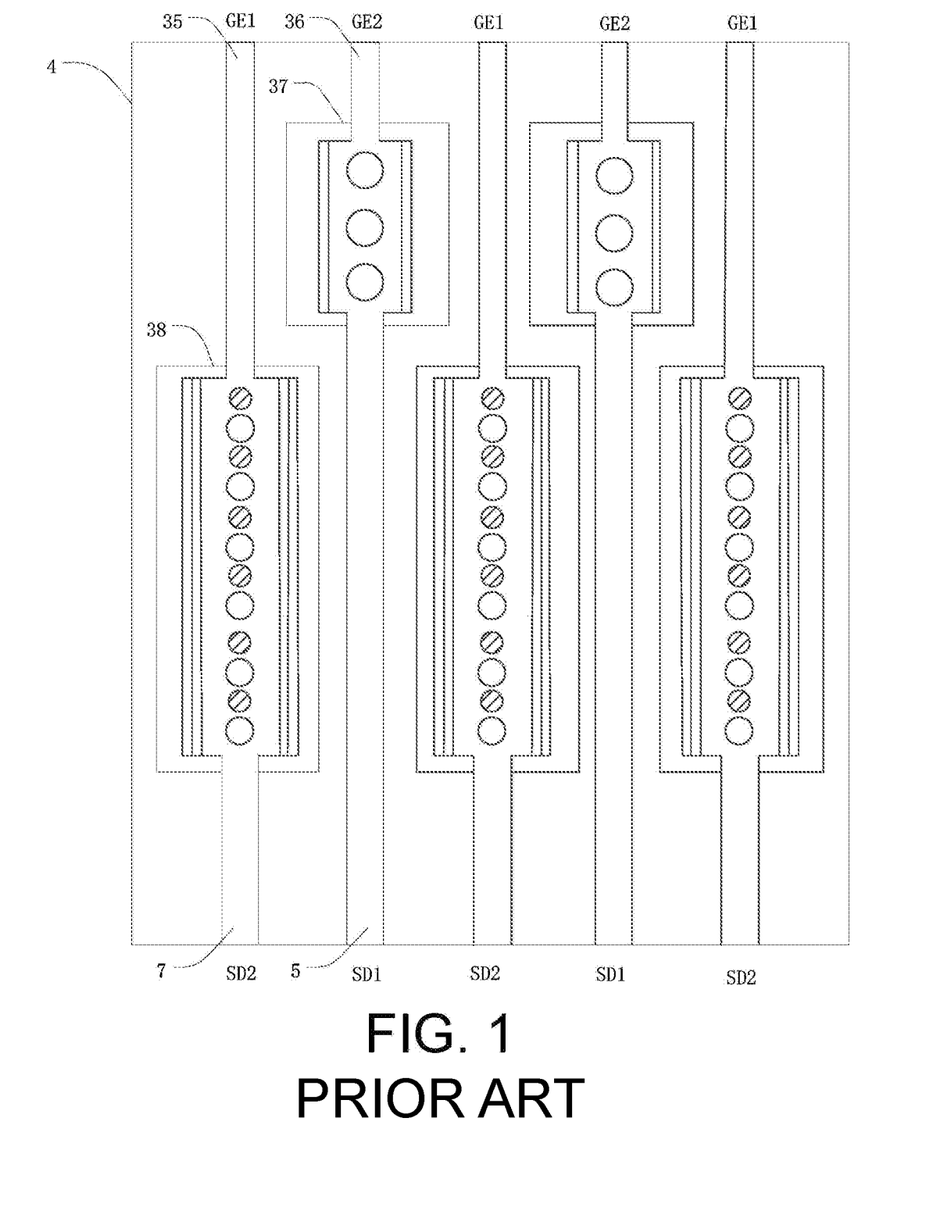
FIG. 1 is a schematic structural view of wires of a folding region of a conventional display panel.

With reference to FIG. 1, wires of the first folding region and the second folding region adopt the same design that a first wire 35 is connected to a second wire changing layer 7, a second wire 36 is connected to a first wire changing layer 5. The first wire 35 is a gate electrode GE1, the second wire 36 is a gate electrode GE2, the first wire changing layer 5 is a source/drain electrode SD1, and the second wire changing layer 7 is a source/drain electrode SD2. The design can avoid the first wiring layer 35 or the second wiring layer 36 from being broken due to greater stress. The first wiring layer 35, the second wiring layer 36, the first wire changing layer 5, and the second wire changing layer 7 are not in the same layer. The first wiring layer 35 is connected to a second wire changing layer 8 through a second through hole 38. The second wiring layer 36 is connected to the first wire changing layer 5 through a first through hole 37. In FIG. 1, an organic insulation layer 4 is disposed below the first wiring layer 35, the second wiring layer 36, the first wire changing layer 5, and the second wire changing layer 7.

In actual processes, a user needs to manufacture the first through hole and the second through hole in a substrate such that the first wire is connected to the second wire changing layer through the second through hole and the second wire is connected to the first wire changing layer through the first through hole.

Figure 2:
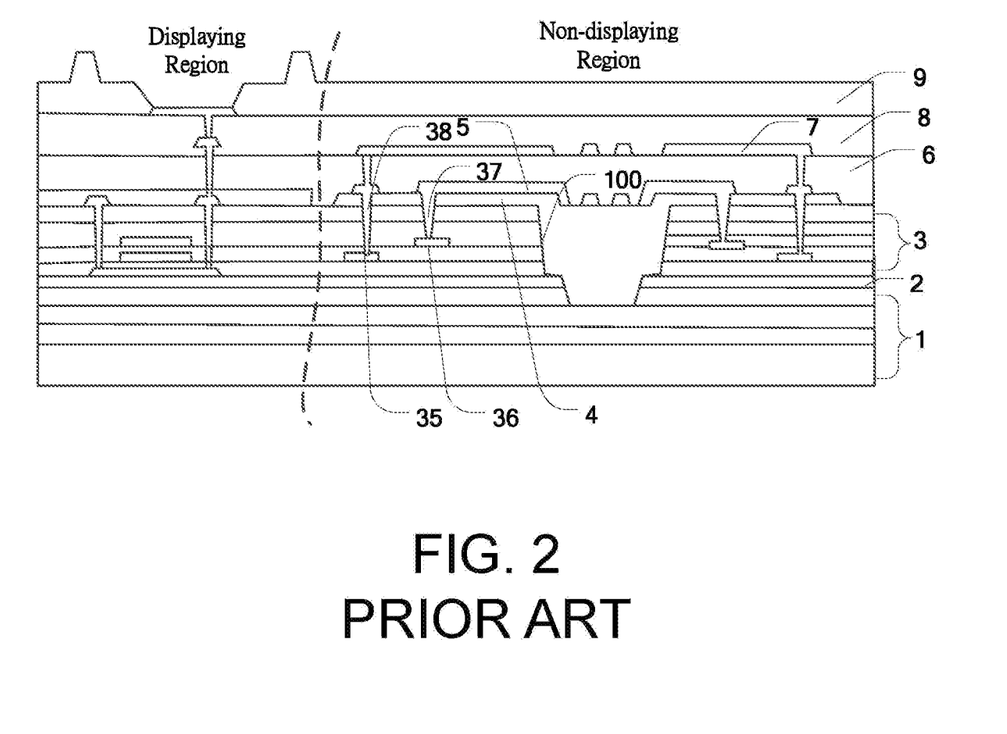
FIG. 2 is a schematic structural view of the conventional display panel.

With reference to FIG. 2, both the displaying region and the non-displaying region comprise a flexible substrate 1, a buffer layer 2, a combination insulation layer 3, an interlayer organic insulation layer 4, a first wire changing layer 5, a first planarization layer 6, a second wire changing layer 7, and a second planarization layer 8. A recess 100 is defined in the non-displaying region, is defined through the combination insulation layer 3, buffer layer 2, and is recessed in an upper surface of the flexible substrate 1. The interlayer organic insulation layer 4 comprises a filling region 41 and an organic insulation layer 42. The filling region 41 is filled into the recess 100. The organic insulation layer 42 is bonded to the combination insulation layer 3 and is connected to the filling region 41. Material of the interlayer organic insulation layer 4 is polyimide (PI) with better flexibility to enhance a folding characteristic of the non-displaying region.

Furthermore, the non-displaying region further comprises a first wiring layer 35, a second wiring layer 36, a first through hole 37, and a second through hole 38. The first wire changing layer 5 is connected to the second wiring layer 36 through the first through hole, and is connected to the first wiring layer 35 through the second through hole. The first through hole 37 is defined through the organic insulation layer 42, and is recessed in the combination insulation layer 3. The second through hole 38 is defined through the organic insulation layer 42, and is recessed in the combination insulation layer 3. A depth of the first through hole is less than a depth of the second through hole.

Figure 3:
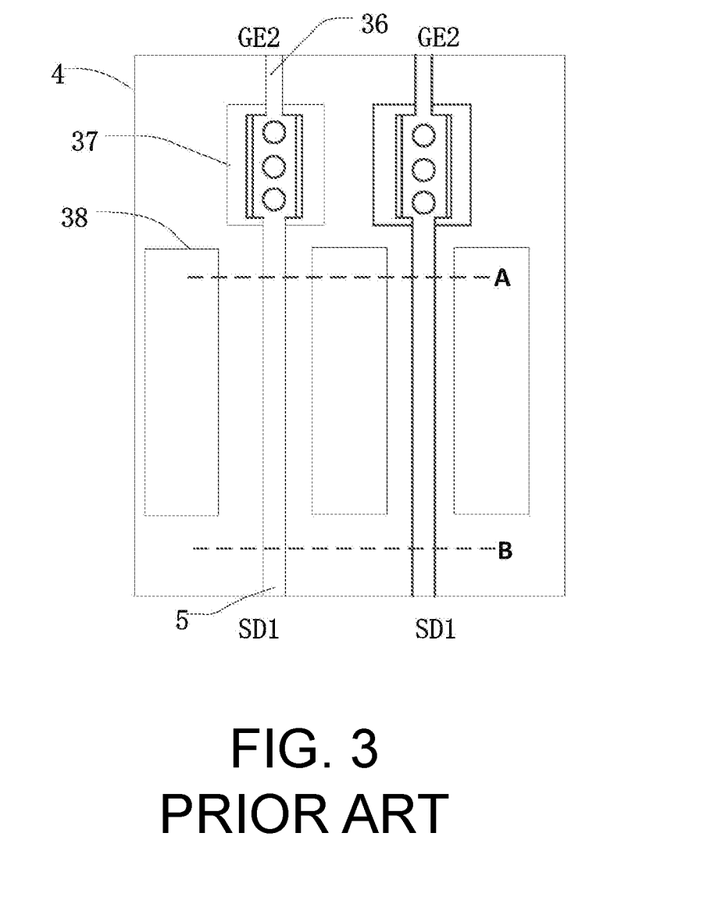
FIG. 3 is a schematic structural view of wires of the conventional first wire changing layer.
Figure 4:
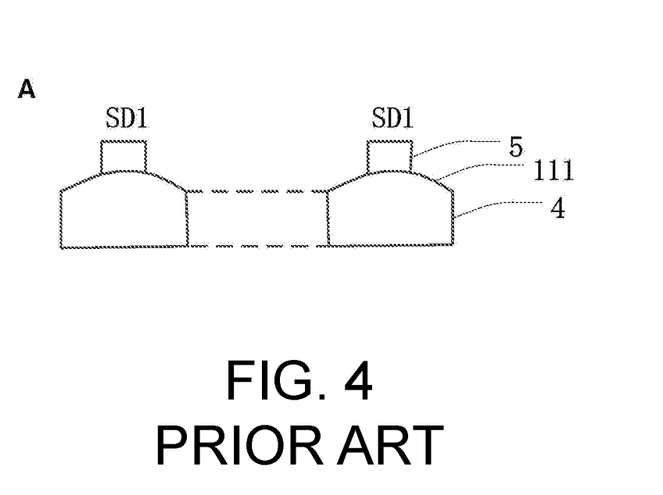
FIG. 4 is a schematic structural view of a cross-section A in FIG. 3.
Figure 5:
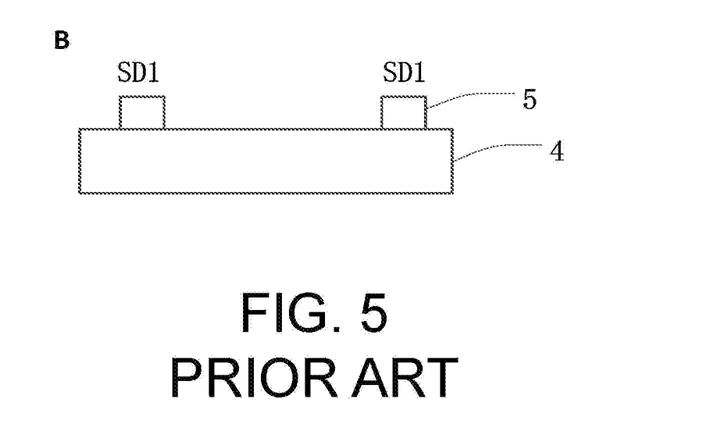
FIG. 5 is a schematic structural view of a cross-section B in FIG. 3.

With reference to FIG. 3, to more precisely present the schematic structural view of the first wire changing layer connected to the second wire through the first through hole, other parts are removed from FIG. 3. FIG. 4 is a schematic structural view of a cross-section A in FIG. 3, and FIG. 5 is a schematic structural view of a cross-section B in FIG. 3. As shown in FIG. 4, the organic insulation layer around the first through hole comprises a protrusion 111. As shown in FIG. 5, no protrusion 111 exists on the organic insulation layer away from the through hole. Therefore, a portion of first wire changing layer passing through the protrusion is easily broken.

In the manufacturing process, each of the first through hole and the second through hole is formed by two hole cutting processes. For example, when a through hole is made, a CNT hole is made on a substrate firsy such that the CNT hole is recessed in a combination insulation layer, then an organic insulation layer is deposited on the combination insulation layer, and finally an organic insulation layer through hole is defined in the undried organic insulation layer. The organic insulation layer through hole communicates with the CNT hole to form a first through hole or a second through hole. After the undried organic insulation layer is defined with the through hole, a portion of the organic insulation layer on an edge of the through hole is warped. Furthermore, the organic insulation layer includes a plurality of organic insulation layer through holes, and a distance between adjacent two organic insulation layer through holes is extremely short. Therefore, the portions of the organic insulation layer on the edges of the through holes are warped to form at least one protrusion. However, metal material is later deposited on an upper surface of the organic insulation layer, in the filling region, and in the through hole to form a metal film layer, and a photoresist layer is manufactured on a surface of the metal film layer, and then the metal film layer is etched to form a first wire changing layer. It should be explained that a portion of the first wire changing layer passing through the protrusion has a bump or notch such that a organic photoresist solution cannot effectively cover to form a photoresist layer. However, during the etching process, a portion of the first wire changing layer on the protrusion is easily etched such that the wires are easily broken.

SUMMARY OF INVENTION

Technical Issue

An objective of the present invention is to provide a flexible display panel and a manufacturing method thereof to solve the technical issue existing that a first wire changing layer existing in the prior art is easily broken and shorted.

Technical Solution

To achieve the above objective, the present invention provides a display panel comprising a flexible substrate, a buffer layer, a combination insulation layer, a recess, organic insulation layer, and a first wire changing layer; the buffer layer disposed on a surface of a side of the flexible substrate; the combination insulation layer disposed on a surface of a side of the buffer layer away from the flexible substrate; the recess defined through the combination insulation layer and the buffer layer, and recessed in the surface of the side of the flexible substrate; the organic insulation layer filled in the recess, and bonded to a surface of a side of the combination insulation layer away from the flexible substrate; and the first wire changing layer disposed on a surface of a side of the organic insulation layer away from the flexible substrate, and extending to the surface of the side of the combination insulation layer away from the flexible substrate Furthermore, an edge line of a side of the organic insulation layer is square waveform, sawtooth waveform, triangular waveform, or sinusoidal waveform.

Furthermore, the combination insulation layer comprises a first insulation layer, a second insulation layer, and a combination dielectric layer; the first insulation layer disposed on the surface of the side of the buffer layer away from the flexible substrate; the second insulation layer disposed on a surface of a side of the first insulation layer away from the flexible substrate; and the combination dielectric layer disposed on a surface of a side of the second insulation layer away from the flexible substrate; wherein a first wiring layer is disposed in the second insulation layer; wherein a second wiring layer is disposed in the combination dielectric layer.

Furthermore, The display panel further comprises a first through hole and a second through hole; the first through hole defined through the combination dielectric layer; and the second through hole defined through the combination dielectric layer and the second insulation layer; wherein the first wire changing layer is connected to the second wiring layer through the first through hole; wherein the first wire changing layer is connected to the first wiring layer through the second through hole.

Furthermore, the combination dielectric layer comprises a first dielectric layer and a second dielectric layer; the first dielectric layer disposed on the surface of the side of the second insulation layer away from the flexible substrate; and the second dielectric layer disposed on a surface of a side of the first dielectric layer away from the flexible substrate; wherein the second wiring layer is disposed in the first dielectric layer.

Furthermore, The display panel further comprises a first planarization layer, a third through hole, a second wire changing layer, a second planarization layer, and a pixel definition layer; the first planarization layer disposed on a surface of a side of the first wire changing layer away from the flexible substrate, disposed on the surface of the side of the combination insulation layer away from the flexible substrate, and disposed on the surface of the side of the organic insulation layer away from the flexible substrate; the third through hole defined through the first planarization layer; the second wire changing layer disposed on a surface of a side of the first planarization layer away from the flexible substrate, and connected to the first wire changing layer through the third through hole; the second planarization layer disposed on a surface of a side of the second wire changing layer away from the flexible substrate; and the pixel definition layer disposed on a surface of a side of the second planarization layer away from the flexible substrate.

Furthermore, the flexible substrate comprises a first flexible substrate, a first barrier layer, a second flexible substrate, and a second barrier layer; the first flexible substrate; the first barrier layer disposed on a surface of a side of the first flexible substrate; the second flexible substrate disposed on a surface of a side of the first barrier layer away from the first flexible substrate; and the second barrier layer disposed on a surface of a side of the second flexible substrate away from the first flexible substrate.

To achieve the above objective, the present invention also provides a display panel manufacturing method, comprising: a flexible substrate providing step providing a flexible substrate; a buffer layer manufacturing step manufacturing a buffer layer on the flexible substrate upper surface; a combination insulation layer manufacturing step manufacturing a combination insulation layer on an upper surface of the buffer layer; a recess manufacturing step manufacturing a recess, wherein the recess is defined through the combination insulation layer and the buffer layer and is recessed in an upper surface of the flexible substrate; an organic insulation layer manufacturing step depositing organic material in the recess and on a portion of an upper surface of the combination insulation layer to form an organic insulation layer; and a first wire changing layer manufacturing step manufacturing a first wire changing layer on the organic insulation layer and a portion of the upper surface of the combination insulation layer.

Furthermore, the combination insulation layer manufacturing step comprises a first insulation layer manufacturing step manufacturing a first insulation layer on an upper surface of the buffer layer; a second insulation layer manufacturing step manufacturing a second insulation layer on an upper surface of the first insulation layer, wherein the first wiring layer is disposed in the second insulation layer; a combination dielectric layer manufacturing step manufacturing a combination dielectric layer on an upper surface of the second insulation layer, wherein the second wiring layer is disposed in the combination dielectric layer; a first through hole manufacturing step manufacturing a first through hole, wherein the first through hole is defined through the combination dielectric layer and is connected to the second wiring layer; and a second through hole manufacturing step manufacturing a second through hole, wherein the second through hole is defined through the combination dielectric layer and the second insulation layer and is connected to the first wiring layer; wherein the first wire changing layer is connected to the second wiring layer through the first through hole; wherein the first wire changing layer is connected to the first wiring layer through the second through hole.

Furthermore, The display panel manufacturing method further comprises: a first planarization layer manufacturing step manufacturing a first planarization layer on the first wire changing layer and the upper surface of the combination insulation layer; a third through hole manufacturing step manufacturing a third through hole, wherein the third through hole is defined through the first planarization layer; a second wire changing layer manufacturing step manufacturing a second wire changing layer on an upper surface of the first planarization layer; and a second planarization layer manufacturing step manufacturing a second planarization layer on an upper surface of the second wire changing layer; wherein the second wire changing layer is connected to the first wire changing layer through the third through hole.

Advantages

The technical effect of the present invention is providing a display panel and a manufacturing method thereof comprising a first wire changing layer disposed on an upper surface of the organic insulation layer and extending to the combination insulation layer, which removes through holes in the conventional organic insulation layer, on one hand mitigates the issue of broken lines in the first wire changing layer, and on the other hand mitigates the issue of shorting of adjacent two of wires in the first wire changing layer because of square waveform, sawtooth waveform, triangular waveform, and sinusoidal waveform of an edge line on a side of the first wire changing layer such that stability of the display panel is improved.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

REFERENCE NUMERALS IN THE DRAWINGS ARE AS FOLLOWS 1 flexible substrate; 2 buffer layer; 3 combination insulation layer; 4 organic insulation layer; 5 first wire changing layer;
6 first planarization layer; 7 second wire changing layer; 8 second planarization layer; 9 pixel definition layer;
31 first insulation layer; 32 second insulation layer; 33 first dielectric layer; 34 second dielectric layer; 35 first wiring layer;
36 second wiring layer; 37 first through hole; 38 second through hole; 61 third through hole; 100 recess;
101 first flexible substrate; 102 first barrier layer; 103 second flexible substrate; 104 second barrier layer;
111 protrusion.

DETAILED DESCRIPTION OF PREFERRED EMBODIMENTS

The preferred embodiments of the present invention are described below with reference to the accompanying drawings, which are used to exemplify the embodiments of the present invention to a person of ordinary skill in the art to make the technical contents of the present invention clearer and easy to understand. However, the present invention may be embodied in many different forms of embodiments, and the scope of the invention is not limited to the embodiments mentioned herein.

The specification and claims of the present invention and terminologies "first", "second", "third", etc. (if existing) in the above accompanying drawings are configured to distinguish similar objects and are not configured to describe a specific sequence or order thereof. It should be understood that such described objects can be exchanged with one another in an adequate condition. Furthermore, terminologies "include", "have" and any variant thereof are intended to inclusive inclusion instead of exclusive inclusion.

Figure 6:
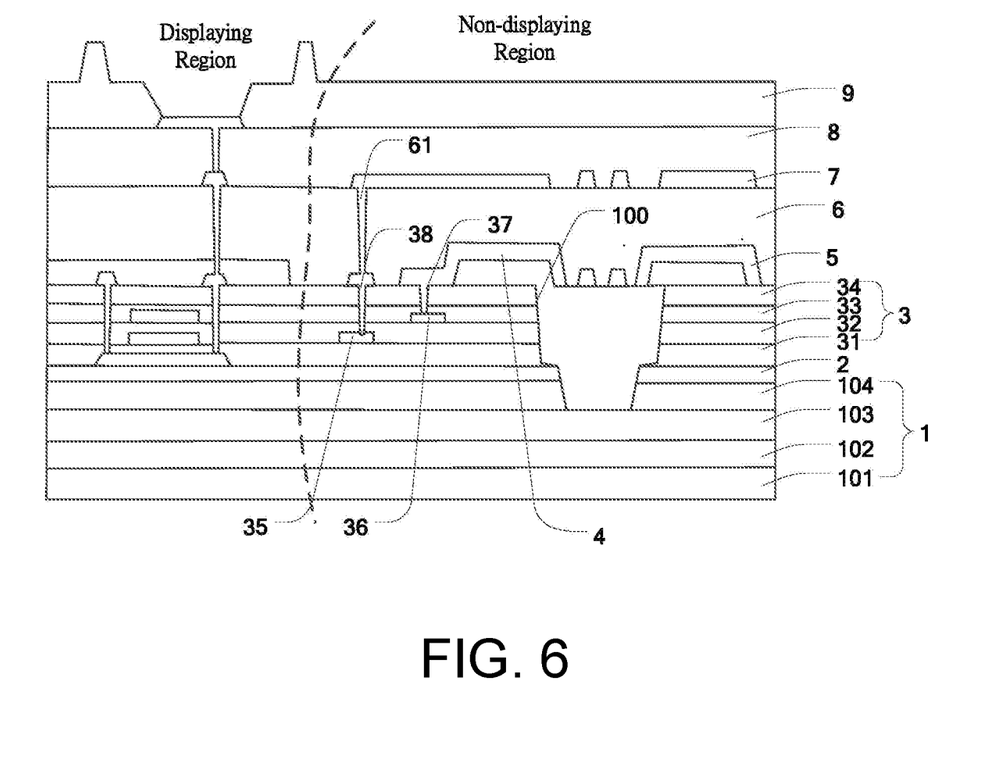
FIG. 6 is a schematic structural view of an embodiment of a display panel of the present invention.

With reference to FIG. 6, the present invention provides a display panel, comprising a displaying region and a non-displaying region. Each of the displaying region and the non-displaying region comprises a flexible substrate 1, a buffer layer 2, combination insulation layer 3, an organic insulation layer 4, a first wire changing layer 5, a first planarization layer 6, a second wire changing layer 7, and a second planarization layer 8. A recess 100 is defined through the combination insulation layer 3, buffer layer 2, and is recessed in an upper surface of the flexible substrate 1.

The flexible substrate 1 comprises a first flexible substrate 101, a first barrier layer 102, a second flexible substrate 103, and a second barrier layer 104. The first flexible substrate 101 and the second flexible substrate 103 is made of polyimide (PI) or other appropriate flexible material. The first barrier layer 102 and the second barrier layer 104 is made of inorganic material to block invasion of external water oxygen.

The buffer layer 2 is disposed on the upper surface of the flexible substrate 1, and the buffer layer 2 can be formed by a chemical vapor deposition technology. Material thereof can be a silicon oxide (SiOx) thin film, a silicon nitride (SiNx) thin film, or a complex thin film including alternately laminated silicon oxide thin films and silicon nitride thin films.

The combination insulation layer 3 comprises a first insulation layer 31, a second insulation layer 32, and a combination dielectric layer 33. The combination dielectric layer 33 comprises a first dielectric layer 331 and a second dielectric layer 332. Material of the first insulation layer 31, the second insulation layer 32, the first dielectric layer 331, and the second dielectric layer 332 is inorganic insulating material. The first wiring layer 35 is disposed in the second insulation layer 32. The second wiring layer 36 is disposed in the first dielectric layer 331. Specifically, the first wiring layer 35 is disposed on an upper surface of the first insulation layer 31, and the second wiring layer 36 is disposed on an upper surface of the second insulation layer 32. The first wiring layer 35 comprises a first gate electrode, and the second wiring layer 36 comprises a second gate electrode 20. Furthermore, the combination insulation layer 3 further comprises a first through hole 37 and a second through hole 38. The first through hole 37 is defined through the second dielectric layer 332 and the first dielectric layer 331. The second through hole 38 is defined through the second dielectric layer 332, the first dielectric layer 331, and the second insulation layer 32.

The recess 100 is defined through the combination insulation layer 3, the buffer layer 2, and is recessed in the second barrier layer 104. The organic insulation layer 4 is filled into the recess 100, and is bonded to the combination insulation layer 3. The recess 100 comprises a first recess and a second recess. The first recess is defined through the combination insulation layer 3, and is defined through the second dielectric layer 34, the first dielectric layer 33, the second insulation layer 32, and the first insulation layer 31 from top to bottom at one time. The second recess is defined sequentially through the buffer layer 2 and the second barrier layer 104, and is recessed in the second flexible substrate 103. The organic insulation layer 4 is a folding portion of the display panel, and has excellent flexibility to achieve flexible folding characteristic of the display panel.

The first wire changing layer 5 is disposed on an upper surface of the organic insulation layer 4, and extends to an upper surface of the combination insulation layer. The first wire changing layer 5 is connected to the second wiring layer 36 through the first through hole 37. The first wire changing layer 35 is connected to the first wire changing layer 5 through the second through hole 38. The first wire changing layer 5 comprises a first source/drain electrode and a second source/drain electrode. The first source/drain electrode is connected to the second gate electrode through the first through hole 37. The second source/drain electrode is connected to the first gate electrode through the second through hole 38.

The first planarization layer 6 is disposed on an upper surface of the first wire changing layer 5, the upper surface of the organic insulation layer 4, and the upper surface of the combination insulation layer 3. The third through hole 61 is defined through the first planarization layer 6. A second wire changing layer 7, a second planarization layer 8, and a pixel definition layer 9 are sequentially disposed on an upper surface of the first planarization layer 6. In the present embodiment, a total thickness of the organic insulation layer 4 and the first wiring layer 5 is less than a thickness of the first planarization layer 6 such that the first wiring layer 5 would not extends excessively out of the first planarization layer 6 to result in corrosion, which further improve stability of the display panel.

Figure 7:
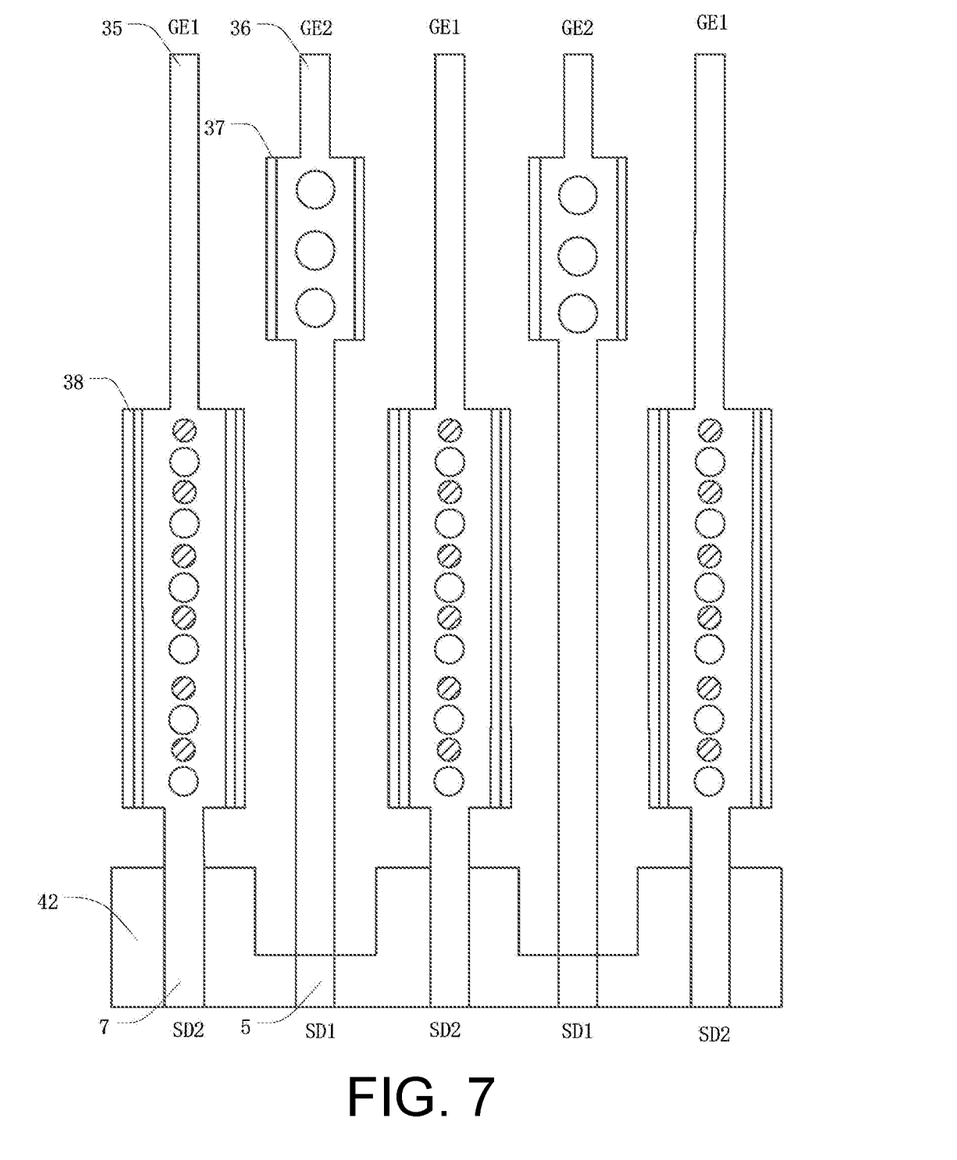
FIG. 7 is a schematic structural view of the folding region of wires of the display panel of an embodiment of the present invention.

With reference to FIG. 7, the first wiring layer 35 is connected to the first wire changing layer through the second through hole 38. The first wire changing layer 5 is connected to the second wire changing layer 7 through the third through hole 61. A projection of the third through hole 61 on the first wiring layer 35 coincides with a projection of the second through hole 38 on the first wiring layer 35. The second wiring layer 36 is connected to the first wire changing layer 5 through the first through hole 37. The first wiring layer 35 is a gate electrode GE1, the second wiring layer 36 is a gate electrode GE2, the first wire changing layer 5 is a source/drain electrode SD1, and the second wire changing layer 7 is a source/drain electrode SD2. In the prior art, the organic insulation layer includes a plurality of organic insulation layer through holes, and a distance between adjacent two organic insulation layer through holes is extremely short. Therefore, the portions of the organic insulation layer on the edges of the through holes has a protrusion. A portion of the first wire changing layer passing through the protrusion has a bump or notch such that a organic photoresist solution cannot effectively cover to form a photoresist layer. However, during the etching process, a portion of the first wire changing layer on the protrusion is easily etched such that the wires are easily broken. With reference to FIG. 6, in the present embodiment, the first through hole 37 and the second through hole 38 are not defined through the organic insulation layer, the organic insulation layer 4 is covered by the first wire changing layer 5 and would not form the above protrusion, which effectively prevent the issue of broken wires caused by the protrusion and improve stability and yield rate of the display panel.

Figure 8:
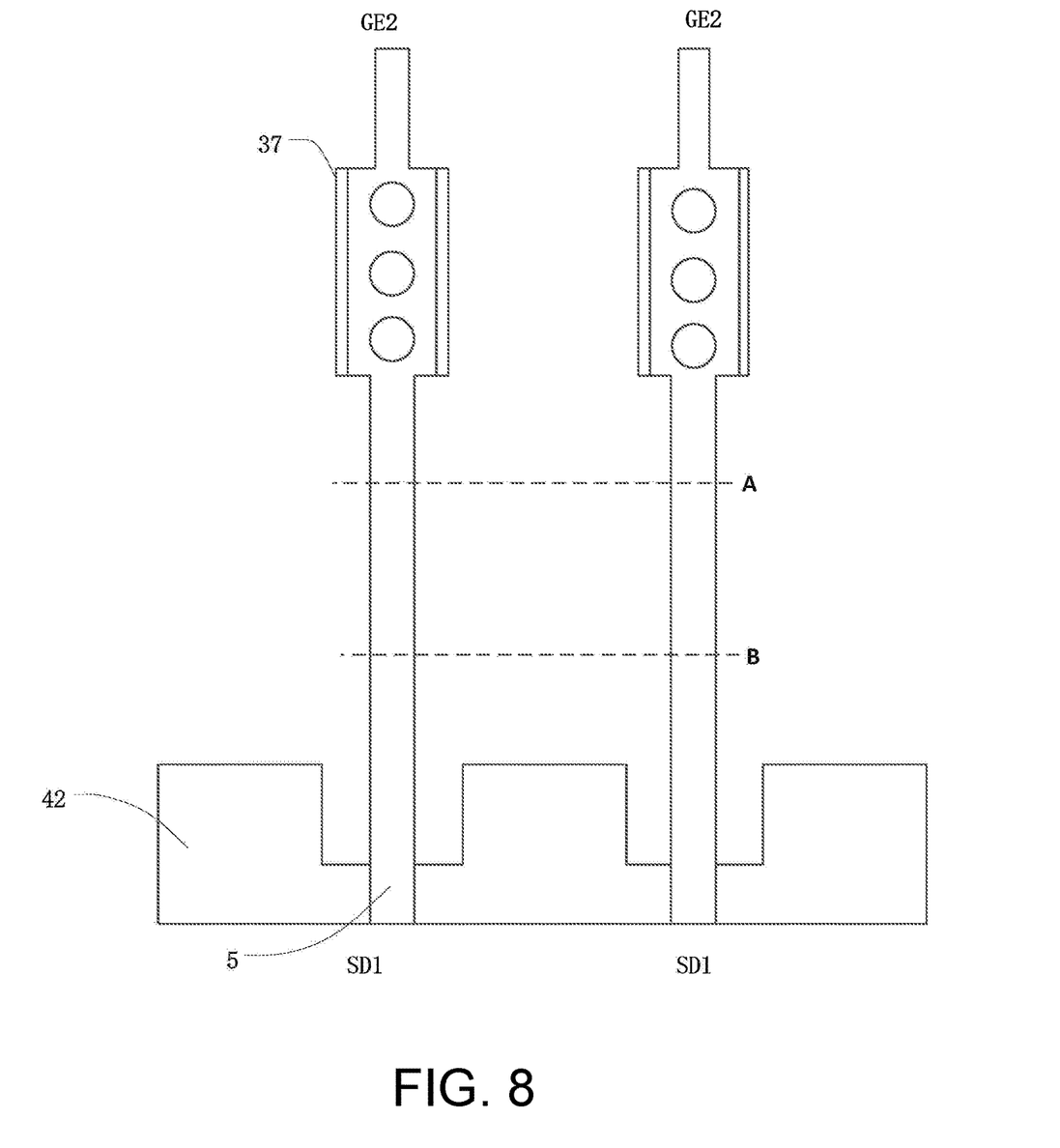
FIG. 8 is a schematic structural view of wires of the first wire changing layer of an embodiment of the present invention.

With reference to FIG. 8, to more precisely present the schematic structural view of the first wire changing layer 5 connected to the second wires through the first through hole, FIG. 8 removes other parts. The organic insulation layer 4 is disposed under a portion of the first wire changing layer, and an edge line on a side of the organic insulation layer 4 is a rectangular waveform. It should be explained that the first wire changing layer 5 comprises a plurality of wires SD1, the wires SD1 are formed in the etching process. Therefore, adjacent two of wires are closer. In the present embodiment, an edge line of a side of the organic insulation layer is square waveform, sawtooth waveform, triangular waveform, sinusoidal waveform, which can solve the shorting issue adjacent two of wires due to etching residue and enhances stability of the display panel. Furthermore, as long as the edge line on the side of the organic insulation layer has a bumpy waveform, the shorting issue of adjacent two of wires due to etching residue can be mitigated.

Figure 9:
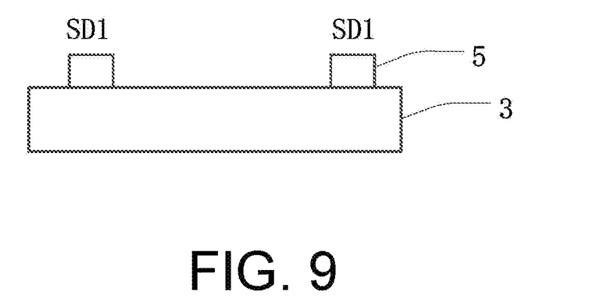
FIG. 9 is a schematic structural view of a cross-section A or a cross-section B in FIG. 8.

With reference to FIGS. 8-9, compared to the prior art (with reference to FIGS. 3-5), the present embodiment removes the protrusion such that the first wire changing layer 5 is located on the upper surface of the combination insulation layer 3. Therefore, during manufacture of the first wire changing layer 5 by a user, the organic insulation layer 42 is not warped, which mitigate the issue that the first wire changing layer 5 is broken. Furthermore, the edge line on the side of the organic insulation layer being square waveform, sawtooth waveform, triangular waveform, sinusoidal waveform can mitigate shorting issues of adjacent two of wires due to etching residue and enhance stability of the display panel.

Figure 10:
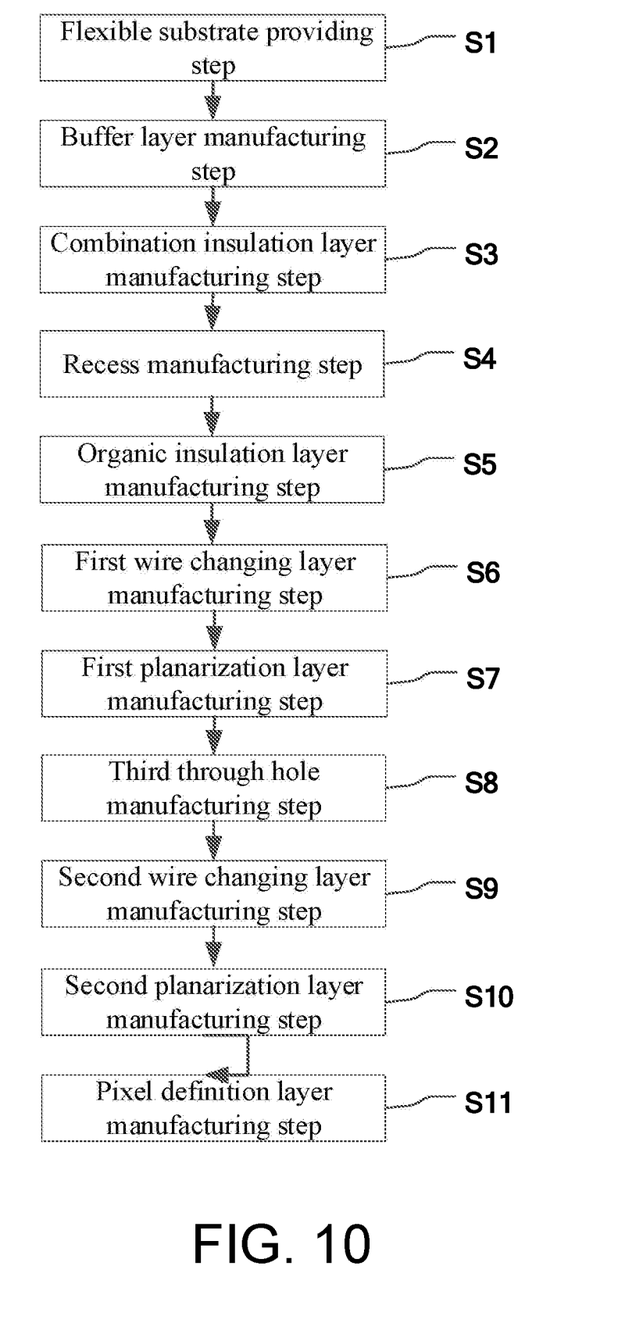
FIG. 10 is a flowchart of a display panel manufacturing method of an embodiment of the present invention.

With reference to FIG. 10, the present embodiment also provides a display panel manufacturing method comprising steps S1-S10 as follows.

A flexible substrate providing step S1 provides a flexible substrate.

A buffer layer manufacturing step S2 manufactures a buffer layer on an upper surface of the flexible substrate.

A combination insulation layer manufacturing step S3 manufactures a combination insulation layer on an upper surface of the buffer layer.

Figure 11:
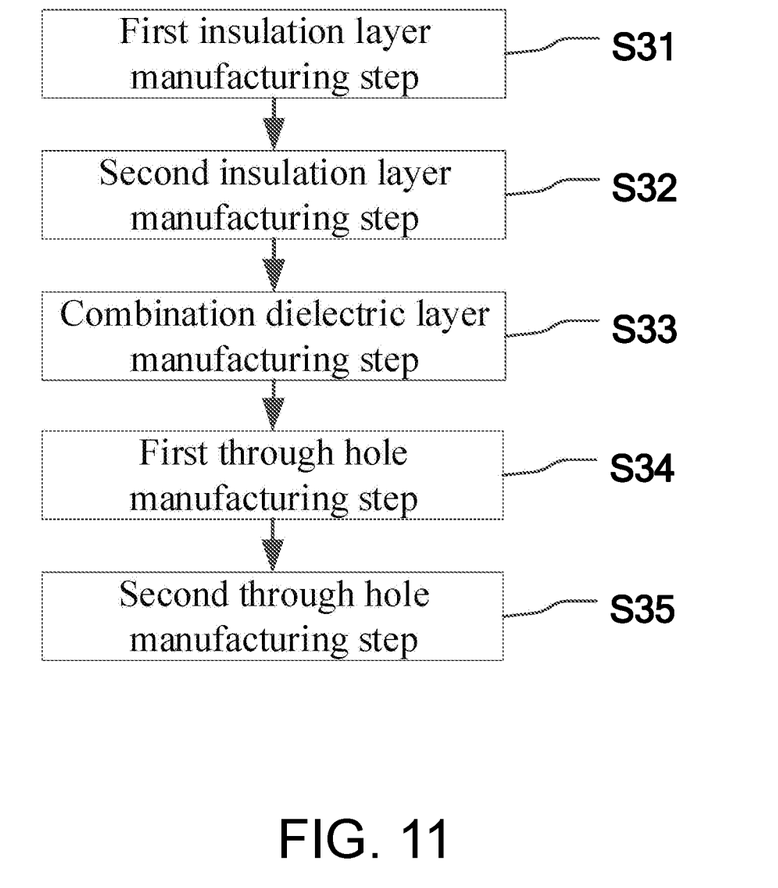
FIG. 11 is a flowchart of a combination insulation layer step of an embodiment of the present invention.

With reference to FIG. 11, the combination insulation layer manufacturing step comprises steps S31-S35 as follows. A first insulation layer manufacturing step S31 manufactures a first insulation layer on the upper surface of the buffer layer. A second insulation layer manufacturing step S32 manufactures a second insulation layer on an upper surface of the first insulation layer, and the first wiring layer is disposed in the second insulation layer. A combination dielectric layer manufacturing step S33 manufactures a combination dielectric layer on an upper surface of the second insulation layer, and the second wiring layer is disposed in the combination dielectric layer. A first through hole manufacturing step S34 manufactures a first through hole, and the first through hole is defined through the combination dielectric layer and is connected to the second wiring layer. A second through hole manufacturing step S35 manufactures a second through hole, and the second through hole is defined through the combination dielectric layer and the second insulation layer and is connected to the first wiring layer. The first wire changing layer is connected to the second wiring layer through the first through hole. The first wire changing layer is connected to the first wiring layer through the second through hole. In the present embodiment, material of each layer of the combination insulation layer can be the same or different, a person of ordinary skill in the art can design according to actual need, and the present embodiment has no limitations thereto.

A recess manufacturing step S4 manufactures a recess, the recess is defined through the combination insulation layer and the buffer layer and is recessed in the upper surface of the flexible substrate.

An organic insulation layer manufacturing step S5 deposits organic material in the recess and on a portion of the combination insulation layer upper surface and forms an organic insulation layer.

A first wire changing layer manufacturing step S6 manufactures a first wire changing layer on the organic insulation layer and a portion of the upper surface of the combination insulation layer.

A first planarization layer manufacturing step S7 manufactures a first planarization layer on the first wire changing layer and the upper surface of the combination insulation layer.

A third through hole manufacturing step S8 manufactures a third through hole, and the third through hole is defined through the first planarization layer.

A second wire changing layer manufacturing step S9 manufactures a second wire changing layer on the first planarization layer upper surface.

A second planarization layer manufacturing step S10 manufactures a second planarization layer on the second wire changing layer upper surface. The second wire changing layer is connected to the first wire changing layer through the third through hole.

A pixel definition layer manufacturing step S11 manufactures a pixel definition layer on an upper surface of the second planarization layer.

The present embodiment provides a display panel manufacturing method, besides the above steps, can further comprise a light emitting layer manufacturing step and a encapsulation layer manufacturing step, which will not be described repeatedly herein.

The present embodiment provides a display panel manufacturing method that compared to the prior art, removes a step manufacturing a through hole in an organic insulation layer such that the manufacturing processes are simplified. Furthermore, the first wire changing layer of the present embodiment disposed on the upper surface of the organic insulation layer and extending to the combination insulation layer removes the through hole in the conventional organic insulation layer, on one hand mitigate the issue of broken wires in the first wire changing layer, and on the other hand mitigates shorting issue of adjacent two of wires in the first wire changing layer because of an edge line on a side of the first wire changing layer being square waveform, sawtooth waveform, triangular waveform, sinusoidal waveform such that stability of the display panel is improved.

The above is only preferred embodiments of the present invention. It should be noted that a person of ordinary skill in the art can make several improvements and modifications without departing from the principle of the present invention. These improvements and modifications should also be considered to be within the scope of protection of the present invention

What is claimed is:

1. A display panel, comprising:
   a flexible substrate;
   a buffer layer disposed on a surface of a side of the flexible substrate;
   a combination insulation layer disposed on a surface of a side of the buffer layer away from the flexible substrate;
   a recess defined through the combination insulation layer and the buffer layer, and recessed in the surface of the side of the flexible substrate;
   an organic insulation layer filled in the recess, and bonded to a surface of a side of the combination insulation layer away from the flexible substrate, wherein the organic insulation layer is formed without a through hole defined through the organic insulation layer; and
   a first wire changing layer disposed on a surface of a side of the organic insulation layer away from the flexible substrate, and extending to the surface of the side of the combination insulation layer away from the flexible substrate;
   wherein the flexible substrate comprises:
     a first flexible substrate;
     a first barrier layer disposed on a surface of a side of the first flexible substrate;
     a second flexible substrate disposed on a surface of a side of the first barrier layer away from the first flexible substrate; and
     a second barrier layer disposed on a surface of a side of the second flexible substrate away from the first flexible substrate;
   wherein the recess is defined through the second barrier layer and connected to the second flexible substrate.

2. The display panel as claimed in claim 1, wherein an edge line of a side of the organic insulation layer is square waveform, sawtooth waveform, triangular waveform, or sinusoidal waveform.

3. The display panel as claimed in claim 1, wherein the combination insulation layer comprises:
   a first insulation layer disposed on the surface of the side of the buffer layer away from the flexible substrate;
   a second insulation layer disposed on a surface of a side of the first insulation layer away from the flexible substrate; and
   a combination dielectric layer disposed on a surface of a side of the second insulation layer away from the flexible substrate;

wherein a first wiring layer is disposed in the second insulation layer;

wherein a second wiring layer is disposed in the combination dielectric layer.

4. The display panel as claimed in claim 3 further comprising:
a first through hole defined through the combination dielectric layer; and
a second through hole defined through the combination dielectric layer and the second insulation layer;
wherein the first wire changing layer is connected to the second wiring layer through the first through hole;
wherein the first wire changing layer is connected to the first wiring layer through the second through hole.

5. The display panel as claimed in claim 3, wherein the combination dielectric layer comprises:
a first dielectric layer disposed on the surface of the side of the second insulation layer away from the flexible substrate; and
a second dielectric layer disposed on a surface of a side of the first dielectric layer away from the flexible substrate;
wherein the second wiring layer is disposed in the first dielectric layer.

6. The display panel as claimed in claim 1 further comprising:
a first planarization layer disposed on a surface of a side of the first wire changing layer away from the flexible substrate, disposed on the surface of the side of the combination insulation layer away from the flexible substrate, and disposed on the surface of the side of the organic insulation layer away from the flexible substrate;
a third through hole defined through the first planarization layer;
a second wire changing layer disposed on a surface of a side of the first planarization layer away from the flexible substrate, and connected to the first wire changing layer through the third through hole;
a second planarization layer disposed on a surface of a side of the second wire changing layer away from the flexible substrate; and
a pixel definition layer disposed on a surface of a side of the second planarization layer away from the flexible substrate.

7. A display panel manufacturing method, comprising:
a flexible substrate providing step providing a flexible substrate;
a buffer layer manufacturing step manufacturing a buffer layer on the flexible substrate upper surface;
a combination insulation layer manufacturing step manufacturing a combination insulation layer on an upper surface of the buffer layer;
a recess manufacturing step manufacturing a recess, wherein the recess is defined through the combination insulation layer and the buffer layer and is recessed in an upper surface of the flexible substrate;
an organic insulation layer manufacturing step depositing organic material in the recess and on a portion of an upper surface of the combination insulation layer to form an organic insulation layer, wherein the organic insulation layer is formed without a through hole defined through the organic insulation layer; and
a first wire changing layer manufacturing step manufacturing a first wire changing layer on the organic insulation layer and a portion of the upper surface of the combination insulation layer;
wherein the flexible substrate comprises:
a first flexible substrate;
a first barrier layer disposed on a surface of a side of the first flexible substrate;
a second flexible substrate disposed on a surface of a side of the first barrier layer away from the first flexible substrate; and
a second barrier layer disposed on a surface of a side of the second flexible substrate away from the first flexible substrate;
wherein the recess is defined through the second barrier layer and connected to the second flexible substrate.

8. The display panel manufacturing method as claimed in claim 7, wherein
the combination insulation layer manufacturing step comprises:
a first insulation layer manufacturing step manufacturing a first insulation layer on an upper surface of the buffer layer;
a second insulation layer manufacturing step manufacturing a second insulation layer on an upper surface of the first insulation layer, wherein the first wiring layer is disposed in the second insulation layer;
a combination dielectric layer manufacturing step manufacturing a combination dielectric layer on an upper surface of the second insulation layer, wherein the second wiring layer is disposed in the combination dielectric layer;
a first through hole manufacturing step manufacturing a first through hole, wherein the first through hole is defined through the combination dielectric layer and is connected to the second wiring layer; and
a second through hole manufacturing step manufacturing a second through hole, wherein the second through hole is defined through the combination dielectric layer and the second insulation layer and is connected to the first wiring layer;
wherein the first wire changing layer is connected to the second wiring layer through the first through hole;
wherein the first wire changing layer is connected to the first wiring layer through the second through hole.

9. The display panel manufacturing method as claimed in claim 7 further comprising:
a first planarization layer manufacturing step manufacturing a first planarization layer on the first wire changing layer and the upper surface of the combination insulation layer;
a third through hole manufacturing step manufacturing a third through hole, wherein the third through hole is defined through the first planarization layer;
a second wire changing layer manufacturing step manufacturing a second wire changing layer on an upper surface of the first planarization layer; and
a second planarization layer manufacturing step manufacturing a second planarization layer on an upper surface of the second wire changing layer;
wherein the second wire changing layer is connected to the first wire changing layer through the third through hole.

* * * * *

UNITED STATES PATENT AND TRADEMARK OFFICE
CERTIFICATE OF CORRECTION

| | | |
|---|---|---|
| PATENT NO. | : 11,355,574 B2 | Page 1 of 1 |
| APPLICATION NO. | : 16/624796 | |
| DATED | : June 7, 2022 | |
| INVENTOR(S) | : Xing Ming | |

It is certified that error appears in the above-identified patent and that said Letters Patent is hereby corrected as shown below:

On the Title Page

Item (73) Assignee:
Change "WUHAN CHINA STAR OPTOELECTRONICS TECHNOLOGY CO., LTD." to
--WUHAN CHINA STAR OPTOELECTRONICS SEMICONDUCTOR DISPLAY TECHNOLOGY CO., LTD.--

Signed and Sealed this
Thirteenth Day of December, 2022

Katherine Kelly Vidal
*Director of the United States Patent and Trademark Office*